United States Patent
Shimizu et al.

(10) Patent No.: US 10,186,613 B2
(45) Date of Patent: Jan. 22, 2019

(54) SEMICONDUCTOR DEVICE

(71) Applicant: Kabushiki Kaisha Toshiba, Minato-ku (JP)

(72) Inventors: Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/252,466

(22) Filed: Aug. 31, 2016

(65) Prior Publication Data
US 2017/0077299 A1    Mar. 16, 2017

(30) Foreign Application Priority Data
Sep. 11, 2015    (JP) .................................. 2015-179039

(51) Int. Cl.
*H01L 29/78*    (2006.01)
*H01L 29/16*    (2006.01)
*H01L 29/47*    (2006.01)

(52) U.S. Cl.
CPC ...... *H01L 29/7827* (2013.01); *H01L 29/1608* (2013.01); *H01L 29/47* (2013.01)

(58) Field of Classification Search
None
See application file for complete search history.

(56) References Cited

U.S. PATENT DOCUMENTS

| 8,829,536 B2 | 9/2014 | Shimizu et al. | |
| 2005/0012143 A1* | 1/2005 | Tanaka | H01L 29/4966 257/328 |
| 2009/0315106 A1* | 12/2009 | Hsieh | H01L 27/0629 257/334 |
| 2011/0017998 A1* | 1/2011 | Nakano | H01L 21/046 257/66 |
| 2011/0193101 A1 | 8/2011 | Yanase et al. | |
| 2013/0062622 A1* | 3/2013 | Tsuchiya | H01L 29/7394 257/77 |
| 2013/0306983 A1* | 11/2013 | Nakano | H01L 29/0623 257/76 |

(Continued)

FOREIGN PATENT DOCUMENTS

| JP | 2011-100967 A | 5/2011 |
| JP | 2011-165902 A | 8/2011 |

(Continued)

*Primary Examiner* — Abul Kalam
(74) *Attorney, Agent, or Firm* — Oblon, McClelland, Maier & Neustadt, L.L.P.

(57) ABSTRACT

A semiconductor device of an embodiment includes an SiC layer having a first and a second plane, an n-type first SiC region in the SiC layer, p-type second SiC regions between the first SiC region and the first plane, n-type third SiC regions between the second SiC regions and the first plane, a gate electrode provided between two p-type second SiC regions, a gate insulating film provided between the gate electrode and the second SiC regions, a metal layer provided between two p-type second SiC regions, and having a work function of 6.5 eV or more, and a first electrode electrically connected to the metal layer, and a second electrode, the SiC layer provided between the first electrode and the second electrode, and a part of the first SiC region is disposed between the gate insulating film and the metal layer.

13 Claims, 8 Drawing Sheets

(56) References Cited

U.S. PATENT DOCUMENTS

| | | | |
|---|---|---|---|
| 2014/0014972 A1* | 1/2014 | Nakano | H01L 21/046 257/77 |
| 2014/0042462 A1* | 2/2014 | Tsuchiya | H01L 29/7394 257/77 |
| 2014/0284623 A1* | 9/2014 | Ota | H01L 29/1608 257/77 |
| 2015/0194492 A1* | 7/2015 | Nakano | H01L 29/1608 257/77 |
| 2017/0077240 A1 | 3/2017 | Shimizu et al. | |
| 2017/0077260 A1 | 3/2017 | Shimizu et al. | |

FOREIGN PATENT DOCUMENTS

| | | |
|---|---|---|
| JP | 2012-178536 A | 9/2012 |
| JP | 2013-197167 A | 9/2013 |
| JP | 2017-55003 A | 3/2017 |
| JP | 2017-55004 A | 3/2017 |

\* cited by examiner

SEMICONDUCTOR DEVICE

CROSS-REFERENCE TO RELATED APPLICATION

This application is based upon and claims the benefit of priority from Japanese Patent Application No. 2015-179039, filed on Sep. 11, 2015, the entire contents of which are incorporated herein by reference.

FIELD

Embodiments described herein relate generally to a semiconductor device.

BACKGROUND

As a next-generation semiconductor device material, SiC (silicon carbide) is expected. SiC has excellent physical properties, compared with Si (silicon), including the band gap being three times, the breakdown field strength being about 10 times, and the thermal conductivity being about three times, as large as those of Si. If these properties are used, a semiconductor device operable at a high temperature with a low loss can be realized.

In transistors using SiC, it is desired to a decrease on-resistance to realize large on-current. As a structure that decreases the on-resistance, there is a vertical transistor having a trench gate structure in which a gate insulating film and a gate electrode are provided in a trench.

DETAILED DESCRIPTION

Figure 1:
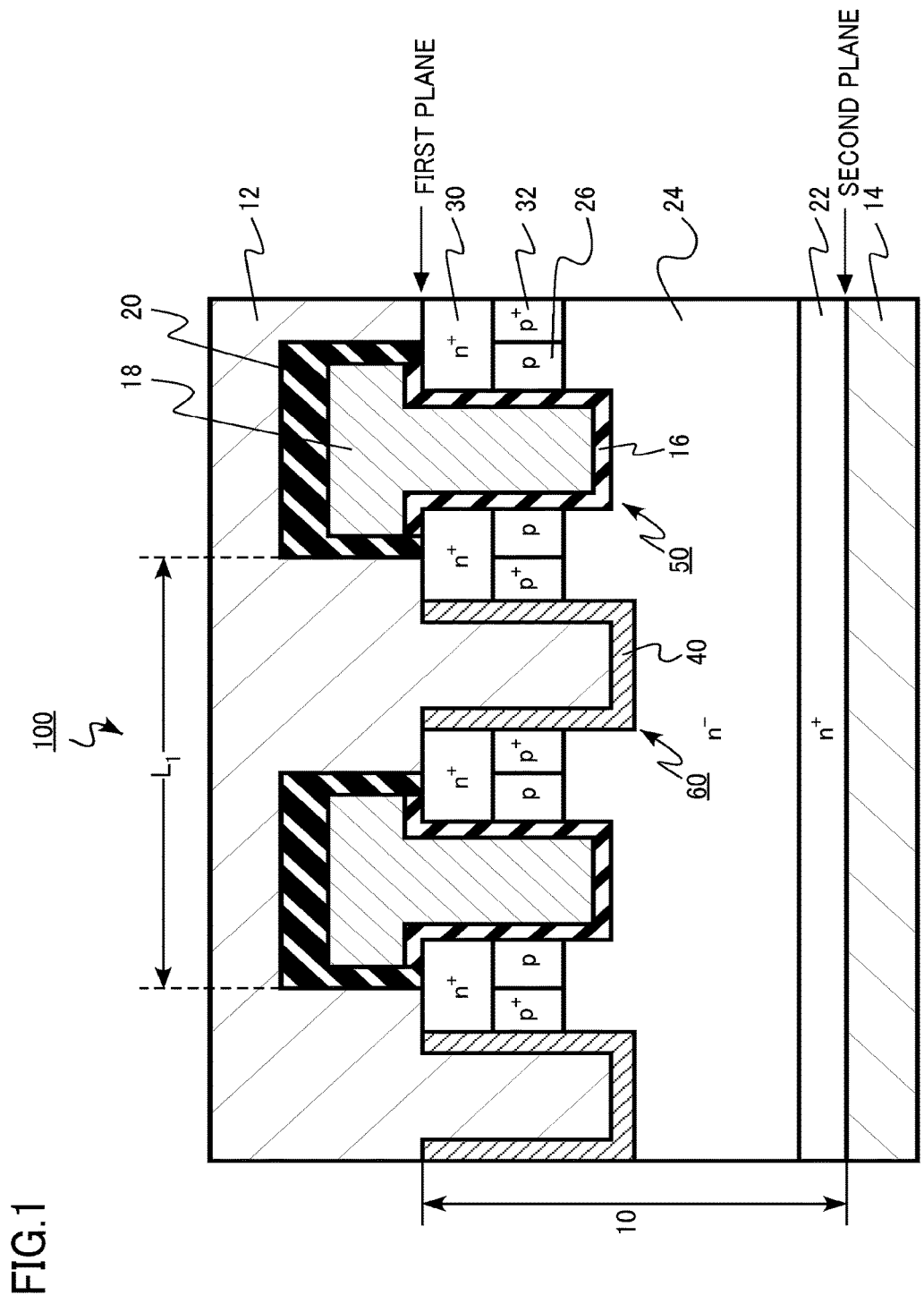
FIG. 1 is a schematic sectional view illustrating a semiconductor device of a first embodiment.

A semiconductor device of an embodiment includes an SiC layer having a first plane and a second plane, an n-type first SiC region provided in the SiC layer, p-type second SiC regions provided in the SiC layer, the second SiC regions provided between the first SiC region and the first plane, n-type third SiC regions provided in the SiC layer, the third SiC regions provided between the second SiC regions and the first plane, a gate electrode provided between one of the second SiC regions and another one of the second SiC regions neighbouring the one of the second SiC regions, a gate insulating film provided between the gate electrode and the one of the second SiC regions, a metal layer provided between the one of the second SiC regions and the other one of the second SiC regions neighbouring the one of the second SiC regions, the one of the second SiC regions dispoded between the another one of the second SiC regions and the other one of the second SiC regions, the metal layer having a work function of 6.5 eV or more, apart of the first SiC region is disposed between the gate insulating film and the metal layer, a first electrode electrically connected to the metal layer, the metal layer provided between the first SiC region and the first electrode, and a second electrode, the SiC layer provided between the first electrode and the second electrode.

Hereinafter, embodiments of the present disclosure will be described with reference to the drawings. Note that, in the description below, the same or similar members are denoted with the same reference sign, and description of a once-described member will be appropriately omitted.

Further, in the description below, notations of $n^+$, n, $n^-$, $p^+$, p, and $p^-$ express relative height of impurity concentrations in respective conductive types. That is, $n^+$ represents a relatively higher n-type impurity concentration than n, and $n^-$ represents a relatively lower n-type impurity concentration than n. Further, $p^+$ represents a relatively higher p-type impurity concentration than p, and p represents a relatively lower p-type impurity concentration than p. Note that type, and $n^-$ type may be simply described as n type, and type and $p^-$ type may be simply described as p type.

In the present specification, "metal layer" is a concept including a semiconductor layer in a metal state by containing a conductive impurity in a high concentration. Here, the semiconductor layer in a metal state means a semiconductor layer in a state where no band gap substantially exists. For example, when polycrystal 3C—SiC is doped with aluminum (Al) that is p-type dopant, a large number of holes is generated in a valence band. Accordingly, the polycrystal 3C—SiC exhibits a metallic electrical characteristic.

First Embodiment

A semiconductor device of the present embodiment includes an SiC layer having a first plane and a second plane, an n-type first SiC region provided in the SiC layer, p-type second SiC regions provided in the SiC layer, the second SiC regions provided between the first SiC region and the first plane, n-type third SiC regions provided in the SiC layer, the third SiC regions provided between the second SiC regions and the first plane, a gate electrode provided between one of the second SiC regions and another one of the second SiC regions neighbouring the one of the second SiC regions, a gate insulating film provided between the gate electrode and the one of the second SiC regions, a metal layer provided between the one of the second SiC regions and the other one of the second SiC regions neighbouring the one of the second SiC regions, the one of the second SiC regions dispoded between the another one of the second SiC regions and the other one of the second SiC regions, the metal layer having a work function of 6.5 eV or more, a part of the first SiC region is disposed between the gate insulating film and the metal layer, a first electrode electrically connected to the metal layer, the metal layer provided between the first SiC region and the first electrode; and a second electrode, the SiC layer provided between the first electrode and the second electrode.

A semiconductor device of the present embodiment includes an SiC layer including a first plane and a second plane, the SiC layer including a first trench and a second trench provided at a side of the first plane, an n-type first SiC region provided in the SiC layer, a p-type second SiC region provided between the first SiC region and the first plane, an n-type third SiC region provided between the second SiC region and the first plane, a gate electrode provided in the first trench, a gate insulating film provided in the first trench, the gate insulating film provided between the gate electrode and the second SiC region, a metal layer provided in the second trench, the metal layer having a work function of 6.5 eV or more, a first electrode electrically connected to the metal layer, and a second electrode provided in the second plane.

FIG. 1 is a schematic sectional view illustrating a configuration of a MOSFET that is a semiconductor device of the present embodiment. A metal oxide semiconductor field effect transistor (MOSFET) 100 is a double implantation MOSFET (DIMOSFET) in which a well region and a source region is formed by ion implantation, for example. The MOSFET 100 is an n-type MOSFET using an electron as a carrier. Further, the MOSFET 100 is a MOSFET having a trench gate structure in which a gate electrode is provided in a trench.

The MOSFET 100 includes an SiC layer 10, a source electrode (first electrode) 12, a drain electrode (second electrode) 14, a gate insulating film 16, a gate electrode 18, and an interlayer insulating film 20. The SiC layer 10 includes a drain region 22, a drift region (n-type first SiC region) 24, a well region (p-type second SiC region) 26, a source region (n-type third SiC region) 30, a well contact region (p-type fourth SiC region) 32, and a metal layer 40. A first trench 50 and a second trench 60 are provided in the SiC layer 10.

The SiC layer 10 is, for example, 4H—SiC.

SiC can employ a plurality of crystal forms. Examples include 4H—SiC in a hexagonal crystal system, 6H—SiC in a hexagonal crystal system, and 3C—SiC in a cubic crystal system. The crystal form of SiC can be identified by observing an atomic array with a transmission electron microscope (TEM). Further, the crystal form of SiC can be identified by an X-ray diffraction (XRD), for example.

The SiC layer 10 includes a first plane and a second plane. In FIG. 1, the first plane is an upper-side plane in FIG. 1, and the second plane is a lower-side plane in FIG. 1. Hereinafter, the first plane is referred to as front face, and the second plane is referred to as back face.

A case where the first plane is a plane inclined with respect to a (0001) face by from 0 to 8 degrees, both inclusive, and the second plane is a plane inclined with respect to a (000-1) face by from 0 to 8 degrees, both inclusive, will be exemplarily described. The (0001) face is referred to as silicon face, and the (000-1) face is referred to as carbon face.

The drain region 22 is an n⁺-type SiC. The drain region 22 contains nitrogen (N) as an n-type impurity, for example. The concentration of the n-type impurity of the drain region 22 is from $1 \times 10^{18}$ to $1 \times 10^{21}$ cm$^{-3}$, both inclusive, for example.

From the viewpoint to decrease contact resistance between the drain electrode 14 and the drain region 22, the concentration of the n-type impurity of the drain region 22 in the second plane is desirably $1 \times 10^{19}$ cm$^{-3}$ or more, and more desirably $1 \times 10^{20}$ cm$^{-3}$ or more.

The drift region 24 is provided on the drain region 22. The drift region 24 is an n⁻-type SiC formed on the drain region 22 by epitaxial growth, for example. The thickness of the drift region 24 is from 5 to 150 μm, both inclusive, for example.

The drift region 24 contains nitrogen (N) as the n-type impurity. The concentration of the n-type impurity of the drift region 24 is from $1 \times 10^{15}$ to $5 \times 10^{16}$ cm$^{-3}$, both inclusive, for example.

A plurality of the well regions 26 is provided between the first plane and the drift region 24. The well regions 26 are provided on the drift region 24. The well regions 26 are p-type SiC. The well regions 26 are provided between the source region 30 and the drift region 24. The well regions 26 function as channel regions of the MOSFET 100.

The well regions 26 contain aluminum (Al) as a p-type impurity, for example. The concentration of the p-type impurity of the well regions 26 is from $5 \times 10^{15}$ to $1 \times 10^{18}$ cm$^{-3}$, both inclusive, for example. The depth of the well regions 26 is from 0.4 to 0.8 μm, both inclusive, for example.

A plurality of the source regions 30 is provided between the first plane and the well regions 26. The source regions 30 are provided on the well regions 26. The source regions 30 are n⁺-type SiC. The source regions 30 contain nitrogen (N) as the n-type impurity. The concentration of the n-type impurity of the source regions 30 is from $1 \times 10^{18}$ to $1 \times 10^{21}$ cm$^{-3}$, both inclusive.

From the viewpoint to decrease contact resistance between the source electrode 12 and the source regions 30, the concentration of the n-type impurity of the source regions 30 in the first plane is desirably $1 \times 10^{19}$ cm$^{-3}$ or more, and more desirably $1 \times 10^{20}$ cm$^{-3}$ or more.

The depth of the source regions 30 is shallower than the depth of the well regions 26, and is from 0.2 to 0.4 μm, both inclusive, for example.

A well contact region 32 is provided between the metal layer 40 and the well region 26. The well contact region 32 is p⁻-type SiC. The well contact region 32 contains aluminum (Al) as the p-type impurity, for example.

The concentration of the p-type impurity of the well contact region 32 is higher than the concentration of the p-type impurity of the well regions 26. The concentration of the p-type impurity of the well contact region 32 is from $1 \times 10^{18}$ to $1 \times 10^{21}$ cm$^{-3}$, both inclusive, for example, The gate insulating film 16 is provided in the first trench 50 provided in the first plane of the SiC layer 10. The gate insulating film 16 is provided between the gate electrode 18, and the drift region 24 and the well regions 26. The gate insulating film 16 is in contact with the drift region 24, the well regions 26, and the source regions 30.

Silicon oxide and a high-k material are applicable to the gate insulating film 16, for example. The high-k material is, for example, hafnium oxide or zirconium oxide.

The gate electrode 18 is provided in the first trench 50. The gate electrode 18 is in contact with the gate insulating film 16. The gate electrode 18 is provided in two well regions 26 of the plurality of well regions 26.

The gate electrode 18 is polycrystal silicon containing the n-type impurity. The n-type impurity is phosphorus (P) or arsenic (As), for example.

The interlayer insulating film 20 is provided on the gate electrode 18. The interlayer insulating film 20 is a silicon oxide film, for example.

The well regions 26 sandwiched between the source regions 30 and the drift region 24 under the gate electrode 18 function as channel regions of the MOSFET 100.

The metal layer 40 is provided in the second trench 60 provided in the first plane of the SiC layer 10. The metal layer 40 is provided to sandwich the drift region 24 with the gate insulating film 16. The depth of the second trench 60 is deeper than the depth of the first trench 50, for example. In other words, a position of an end portion of the metal layer 40 at a back face side of the SiC layer 10 is deeper than a position of an end portion of the gate insulating film 16 at the back face side.

The metal layer 40 is in contact with the drift region 24, the well contact region 32, and the source regions 30. Junction between the metal layer 40 and the drift region 24 is Schottky junction. Whether the junction between the metal layer 40 and the drift region 24 is Schottky junction can be determined by measuring a voltage-current characteristic between the source electrode 12 and the drain electrode 14 in an OFF state of the MOSFET 100.

The junction between the metal layer 40 and the well contact region 32 is desirably ohmic junction.

A work function of the metal layer 40 is 6.5 eV or more. The work function of the metal layer 40 is desirably 6.8 eV or more, and more desirably 6.86 eV or more.

The metal layer 40 is 3C—SiC containing the p-type impurity, for example. The metal layer 40 is single crystal or polycrystal 3C—SiC. 3C—SiC of the metal layer 40 is in a metal state.

Whether 3C—SiC of the metal layer 40 is in a metal state can be seen by measuring temperature dependence of the electrical characteristic. Further, the work function can be determined by measurement of Kelvin probe force microscopy (KPFM). The work function can also be calculated by measuring the height of the Schottky junction between the metal layer 40 and the drift region 24, as described above.

All of SiC existing in the metal layer 40 are desirably 3C—SiC in a substantial manner. For example, when diffraction peaks caused in crystal faces in crystal forms other than 3C—SiC are a noise level or less, the crystal forms other than 3C—SiC are determined not to exist, by an XRD method.

A volume ratio occupied by 3C—SiC of the SiC existing in the metal layer 40 is desirably 90% or more. For example, by counting an occupied area of crystal grains of 3C—SiC in an image acquired by the TEM, whether the volume ratio occupied by 3C—SiC is 90% or more can be determined.

A volume occupied by 3C—SiC of the SiC existing in the metal layer 40 is desirably larger than a volume occupied by 4H—SiC. For example, by counting the occupied area of the crystal grains of 3C—SiC and an occupied area of crystal grains of 4H—SIC in an image acquired by the TEM, whether the volume occupied by 3C—SiC is larger than the volume occupied by 4H—SiC can be determined.

The p-type impurity contained in the metal layer 40 is boron (B), aluminum (Al), gallium (Ga), or indium (In). The concentration of the p-type impurity in the metal layer 40 is desirably $1 \times 10^{20}$ cm$^{-3}$ or more, and more desirably $1 \times 10^{21}$ cm$^{-3}$ or more, from the viewpoint to cause 3C—SiC of the metal layer 40 to be in a metal state.

3C—SiC of the metal layer 40 is formed by a chemical vapor deposition (CVD) method at a temperature of 1200° C. or less. The impurity may just be introduced in a trimethyl structure (trimethylboron, trimethylaluminum, trimethylgallium, or trimethylindium). In low-temperature growth of 1200° C. or less, a 3C—SiC structure preferentially grows, and in an interface between 3C—SiC and 4H—SiC, crystallization of 3C—SiC proceeds while slide of the interface occurs. Accordingly, single crystal or polycrystal, a large volume of p-type dopant-introduced, metallic, and uniform 3C—SiC can be formed.

As another film forming method, a method of depositing a polysilicon film, being doped with trimethylaluminum, and performing carbonization is also effective. The carbonization of the polysilicon film is performed by thermal treatment of from 1000 to 1200° C., both inclusive, in an atmosphere containing ethane ($C_2H_6$), ethylene ($C_2H_6$), or acetylene ($C_2H_2$), for example. The thermal treatment is performed in an atmosphere containing plasma of ethane ($C_2H_6$), ethylene ($C_2H_6$), or acetylene ($C_2H_2$). As a result, the poly-SiC in the 3C structure, which is the most stable in this temperature band among poly types of SiC structures, can be obtained.

The source electrode 12 is provided on the front face of the SiC layer 10. The source electrode 12 is electrically connected to the source regions 30 and the metal layer 40. The source electrode 12 is in contact with the source regions 30 and the metal layer 40. The source electrode 12 also has a function to provide a potential to the well regions 26.

The source electrode 12 is metal. The metal forming the source electrode 12 is a stacked structure of titanium (Ti) and aluminum (Al), for example. The metal forming the source electrode 12 may react with the SiC layer 10 to form metal silicide or metal carbide.

The drain electrode 14 is provided on the back face of the SiC layer 10. The drain electrode 14 is electrically connected to the drain region 22. The drain electrode 14 is in contact with the drain region 22.

The drain electrode 14 is metal. The metal forming the drain electrode 14 is nickel silicide (NiSi), for example.

Hereinafter, functions and effects of the semiconductor device of the present embodiment will be described.

By employment of the trench gate structure like the MOSFET 100 of the present embodiment, an area of a unit cell of the vertical MOSFET can be reduced. Therefore, a current amount flowable per unit area is increased, and the on-resistance of the MOSFET is decreased. However, in the OFF state of the MOSFET 100, the electric field is concentrated to corner portions of a bottom portion of the first trench 50, and the gate insulating film 16 may be broken down.

Figure 2:
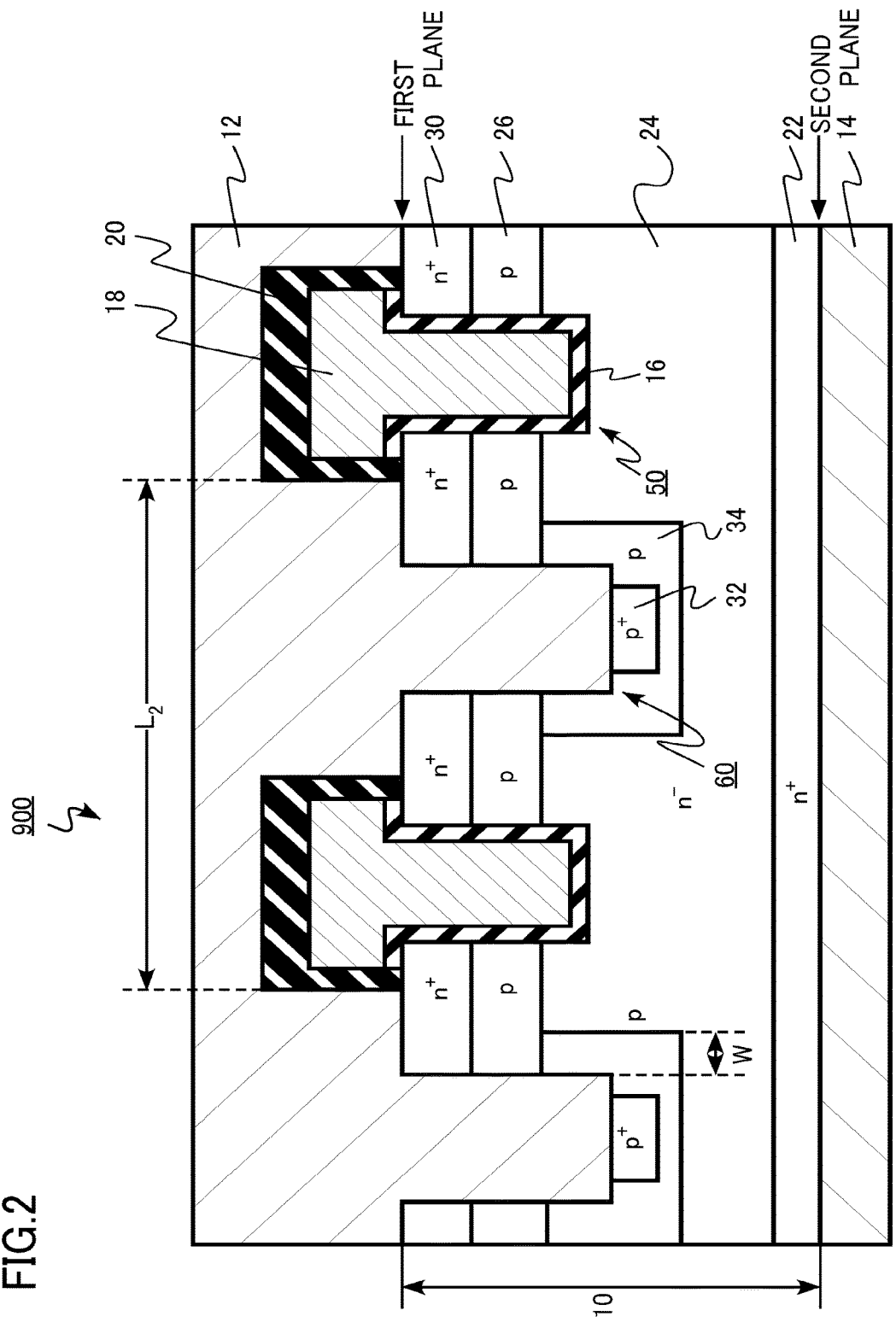
FIG. 2 is a schematic sectional view illustrating a semiconductor device of a comparative example.

FIG. 2 is a schematic sectional view illustrating a configuration of a MOSFET of a comparative example. A MOSFET 900 of the comparative example is a vertical MOSFET in a trench gate structure, similarly to the present embodiment.

The MOSFET 900 includes a p-type SiC region 34 around a second trench 60. The p-type SiC region 34 is connected to a well region 26. Further, a well contact region 32 is provided on a bottom portion of the second trench 60.

In an OFF state of the MOSFET 900, a depletion layer extends in a drift region 24 from the p-type SiC region 34 toward a first trench 50. Therefore, an electric field in corner portions of a bottom portion of the first trench 50 is reduced. Therefore, breakdown of the gate insulating film 16 is suppressed.

As the width of the p-type SiC region 34 (W in FIG. 2), a predetermined width is required so that the depletion layer extending in the p-type SiC region 34 does not overlap with an source electrode 12 in the second trench 60. The p-type SiC region 34 has the predetermined width, so that a breakdown voltage of pn junction is maintained.

Further, the p-type SiC region 34 is formed by oblique ion implantation of the p-type impurity to a side face of the second trench 60 after forming the second trench 60. In this case, the width of an opening of the second trench 60 needs to be increased so that a sufficient amount of the p-type impurity can be introduced into the side face of the second trench 60 in an SiC layer 10. Therefore, a pitch ($L_2$ in FIG. 2) of a unit cell of the MOSFET 900 becomes large. When the pitch of the unit cell of the MOSFET 900 becomes large, the on-resistance of the MOSFET 900 is increased.

In the present embodiment, the metal layer 40 having the work function of 6.5 eV or more is provided in the second trench 60. The junction between the metal layer 40 and the n-type drift region 24 is the Schottky junction. In the OFF state of the MOSFET 900, the depletion layer extends in the drift region 24 from the metal layer 40 toward the first trench 50. Therefore, the electric field in the corner portions of the bottom portion of the first trench 50 is reduced, similarly to the comparative example. Therefore, the breakdown of the gate insulating film 16 is suppressed.

In the present embodiment, the metal layer 40 is provided in place of the p-type SiC region 34 of the comparative example. It becomes unnecessary to provide the p-type SiC region for electric field reduction, around the second trench 60. Further, the width of the metal layer 40 is determined by electrical resistance only, and can be made sufficiently narrower than the width W of the p-type SiC region. Further, the width of the clearance of the second trench 60 is not subject to the restriction associated with the oblique ion implantation, like the comparative example. Therefore, a pitch ($L_1$ in FIG. 1) of a unit cell of the MOSFET 100 can be made smaller than the pitch ($L_2$ in FIG. 2) of the unit cell of the MOSFET 900. Therefore, the on-resistance of the MOSFET 100 is decreased, compared with the MOSFET 900.

To secure the breakdown voltage in the OFF state of the MOSFET 100, a Schottky barrier of the junction between the metal layer 40 and the n-type drift region 24 needs to be high. That is, the material needs to have a large work function. Further, from the viewpoint to decrease the contact resistance between the metal layer 40 and the p-type well contact regions 32, the material needs to have a large work function.

Figure 3:
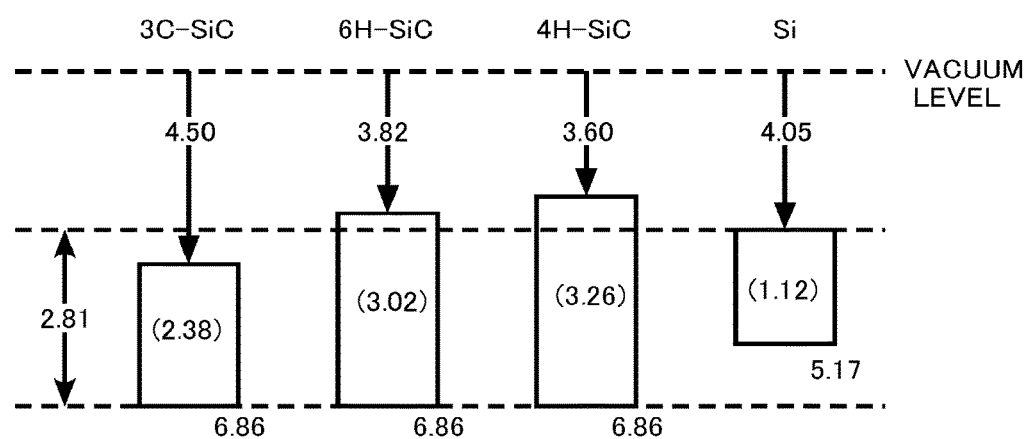
FIG. 3 is an explanatory view of functions and effects of the semiconductor device of the first embodiment.

FIG. 3 is an explanatory view of functions and effects of the semiconductor device of the present embodiment. FIG. 3 illustrates calculation results of energy band structures of semiconductors by first principle calculation.

FIG. 3 is a diagram illustrating energy band structures of silicon (Si), 4H—SiC, 6H—SiC, and 3C—SiC. FIG. 3 illustrates an energy difference (electron affinity) between a vacuum level and a lower end of a conduction band, an energy difference between the vacuum level and an upper end of a valence band, and band gap energy, of each material. In FIG. 3, the bracketed numerical values are the band gap energy.

Note that the work function is an energy difference between the vacuum level (vacuum energy level) and a Fermi level of a target substance. Further, the electron affinity is a difference between the vacuum level (vacuum energy level) and an energy level of the lower end of the conduction band of a target substance.

Further, in a case of introducing the n-type impurity into the semiconductor and causing the semiconductor to be in a metal state, the Fermi level of the semiconductor is considered to be matched with the energy level of the lower end of the conduction band. Therefore, the work function of the semiconductor can be considered to be matched with the electron affinity. Further, in a case of introducing the p-type impurity into the semiconductor, and causing the semiconductor to be in a metal state, the Fermi level of the semiconductor is considered to be matched with the energy level of the upper end of the valence band. Therefore, the work function of the semiconductor can be considered to be matched with the energy difference between the vacuum level and the upper end of the valence band.

As illustrated in FIG. 3, the electron affinity of 4H—SiC is 3.60 eV. To make the Schottky barrier of the junction between the metal layer 40 and the n-type drift region 24 sufficiently high, a material having a sufficiently large work function with respect to 3.60 eV needs to be used for the metal layer 40. Further, the energy difference between the vacuum level of 4H—SiC and the upper end of the valence band is 6.86 eV. Therefore, from the viewpoint to decrease the contact resistance between the metal layer 40 and the p-type well contact regions 32, a material having a work function of 6.50 eV or more, desirably 6.8 eV or more, more desirably 6.86 eV or more needs to be used for the metal layer 40.

For example, in a case of introducing the p-type impurity into 4H—SiC, and causing the 4H—SiC to be in a metal state, the work function of 4H—SiC is 6.86 eV. Therefore, 4H—SiC in a metal state can be applied to the metal layer 40.

In the present embodiment, 3C—SiC having the p-type impurity introduced into the metal layer 40, and made in a metal state is applied. As illustrated in FIG. 3, it has been found that the energy levels of the upper ends of the valence bands of 3C—SiC and 4H—SiC are matched by the first principle calculation. Therefore, in a case of applying 3C—SiC in a metal state to the metal layer 40, the Schottky barrier of the junction between the metal layer 40 and the n-type drift region 24 becomes sufficiently high. Further, the contact resistance between the metal layer 40 and the p-type well contact regions 32 is decreased.

In a case of introducing the p-type impurity into 4H—SiC and activating the 4H—SiC, thermal treatment of 1600° C. or more is necessary. For example, when the thermal treatment of 1600° C. or more is performed after the gate insulating film 16 is formed, the quality of the gate insulating film 16 becomes deteriorated, and the reliability of the MOSFET 100 may be decreased.

Furthermore, the side face and a bottom face of the trench have different orientations. Therefore, if 4H—SiC epitaxially grow, the growth becomes discontinuous. Further, the growth inside the trench cannot reflect substrate information, unlike conventional growth where base information by steps is obtained, and it is difficult to limit the structure to a 4H structure only from the base information. At a high temperature, a 3C structure, a 6H structure, a 4H structure, and the like are appropriately mixed. In the present embodiment, the 3C structure can be the main structure by employing low-temperature growth.

3C—SiC is a more stable crystal format a low temperature than the crystal forms of 4H—SiC, 6H—SiC, and the like. 3C—SiC can perform crystal formation and activation of the p-type impurity at a low temperature of 1200° C. or less, which is a highest attainment temperature. Furthermore, at this temperature, uniform formation of the 3C structure that is the most stable structure can be expected.

Therefore, according to the present embodiment, a decrease in reliability of the MOSFET 100 can be suppressed.

Note that the p-type impurity contained in the metal layer 40 is desirably aluminum (Al). Formation of SiC containing aluminum (Al) can be easily realized by using trimethylaluminum as a raw material gas in the CVD for depositing SiC.

A volume ratio occupied by 3C—SiC of SiC existing in the metal layer 40 is desirably 90% or more. Further, all of the SiC existing in the metal layer 40 is desirably 3C—SiC in a substantial manner. If other crystal forms such as 4H—SiC exist, resistance of the metal layer 40 may be increased. It can be considered that the resistance increases because an interface portion of different crystal forms has high resistance.

From the viewpoint to suppress a leak current at the time of reverse bias of the Schottky junction between the metal layer 40 and the n-type drift region 24, the metal layer 40 is desirably single crystal.

The depth of the second trench 60 is desirably deeper than the depth of the first trench 50. When the depth of the second trench 60 is deeper than the depth of the first trench 50, a reduction effect of the electric field in the corner portions of the bottom portion of the first trench 50 becomes large.

As described above, according to the present embodiment, the MOSFET 100 having low on-resistance is realized. Further, the MOSFET 100 with improved reliability is realized.

Second Embodiment

A semiconductor device of the present embodiment is similar to that in the first embodiment except that 3C—SiC containing a p-type impurity is applied to a material of a gate electrode. Therefore, description of content overlapping with the first embodiment is omitted.

A MOSFET of the present embodiment will be described with reference to FIG. 1.

A gate electrode 18 of the MOSFET of the present embodiment is 3C—SiC containing a p-type impurity. The gate electrode 18 is polycrystal 3C—SiC.

All of the SiC existing in the gate electrode 18 is desirably 3C—SiC in a substantial manner. For example, when diffraction peaks caused in crystal faces in crystal forms other than 3C—SiC are a noise level or less, the crystal forms other than 3C—SiC are determined not to exist, by an XRD method.

A volume ratio occupied by 3C—SiC of the SiC existing in the gate electrode 18 is desirably 90% or more. For example, by counting an occupied area of crystal grains of 3C—SiC in an image acquired by a TEM, whether the volume ratio occupied by 3C—SiC is 90% or more can be determined.

A volume occupied by 3C—SiC of the SiC existing in the gate electrode 18 is desirably larger than a volume occupied by 4H—SiC. For example, by counting the occupied area of the crystal grains of 3C—SiC and an occupied area of crystal grains of 4H—SIC in an image acquired by the TEM, whether the volume occupied by 3C—SiC is larger than the volume occupied by 4H—SiC can be determined.

The p-type impurity contained in the gate electrode 18 is aluminum (Al), gallium (Ga), or indium (In). The concentration of the p-type impurity in the gate electrode 18 is desirably $1 \times 10^{19}$ cm$^{-3}$ or more, and more desirably $1 \times 10^{20}$ cm$^{-3}$ or more, and still more desirably $1 \times 10^{21}$ cm$^{-3}$ or more, from the viewpoint to cause 3C—SiC of the gate electrode 18 to be in a metal state.

Hereinafter, functions and effects of the semiconductor device of the present embodiment will be described.

From the viewpoint to realize a device with low power consumption, suppression of a leak current in an OFF state of the MOSFET is required. To suppress the leak current in the OFF state of the MOSFET, a threshold voltage of the MOSFET may just be made high.

To increase the threshold voltage of the n-type MOSFET, bringing an energy level of an upper end of a valence band of a semiconductor in a p-type channel region, and a work function of the gate electrode close to each other can be considered.

In the OFF state of the MOSFET, an energy band of the semiconductor is bent such that a Fermi level of the p-type channel region and the work function of the gate electrode are matched. The Fermi level of the p-type channel region is positioned close to the upper end of the valence band of the semiconductor of the p-type channel region. Therefore, by bringing the energy level of the upper end of the valence band of the semiconductor of the p-type channel region, and the work function of the gate electrode close to each other, the bending of the energy band of the semiconductor in the OFF state of the MOSFET is suppressed. Therefore, the threshold voltage of the MOSFET becomes high.

For example, in a case where the p-type channel region is 4H—SiC, the threshold voltage of the MOSFET becomes higher when p-type silicon is used for the gate electrode rather than when n-type silicon is used for the gate electrode. This is because a work function (an energy difference between a vacuum level and an upper end of a valence band) of the p-type silicon is closer to an energy level of an upper end of a valence band of a semiconductor of 4H—SiC than a work function (an energy difference (electron affinity) between a vacuum level and a lower end of a conduction band) of the n-type silicon, as illustrated in FIG. 3. Compared with the case where the n-type silicon is used for the gate electrode, the threshold voltage can be made higher by 1.12 V corresponding to the band gap energy of silicon.

Further, in a case where the p-type channel region is 4H—SiC, the threshold voltage can be made higher when the p-type 4H—SiC is used for the gate electrode. This is because a work function of the p-type 4H—SiC is matched with the energy level of the upper end of the valence band of the semiconductor of 4H—SiC. Compared with the case where the n-type silicon is used for the gate electrode, the threshold voltage can be made higher by 2.81 V.

In the present embodiment, the p-type 3C—SiC containing the p-type impurity is applied to the gate electrode 18. As illustrated in FIG. 3, it has been found that the energy levels of the upper ends of the valence bands of 3C—SiC and 4H—SiC are matched by first principle calculation. Therefore, even in a case of applying the p-type 3C—SiC to the gate electrode, the threshold voltage can be made higher by 2.81 V, compared with the case of using the n-type silicon to the gate electrode, like the first embodiment.

In a case where the p-type impurity is contained in the gate electrode 18 of SiC, diffusion of the p-type impurity due to thermal treatment in forming the gate electrode becomes a problem. Further, deterioration of the quality of a gate insulating film due to thermal treatment in forming the gate electrode becomes a problem.

For example, in a case of introducing the p-type impurity to 4H—SiC and activating the 4H—SiC, thermal treatment of 1600° C. or more is necessary. The p-type impurity is diffused in the gate insulating film and the SiC layer by high-temperature thermal treatment. The diffused p-type impurity forms a trap level, and characteristic variation of the MOSFET may be caused, for example. The characteristic variation of the MOSFET is variation of the threshold voltage, for example. Therefore, reliability of the MOSFET is decreased. Especially, in a case where the p-type impurity is boron (B) with a small atomic radius and rapid diffusion, the problems of the characteristic variation of the MOSFET become serious.

Further, when thermal treatment of 1600° C. or more is performed, the quality of the gate insulating film is deteriorated, and the reliability of the MOSFET may be decreased.

3C—SiC is a more stable crystal format a low temperature than the crystal forms of 4H—SiC, 6H—SiC, and the like. 3C—SiC can perform crystal formation and activation of the p-type impurity at a low temperature of 1200° C. or less, which is a highest attainment temperature. If a film is formed at a low temperature, a 3C structure is the most stable poly type, and it can be expected that most polycrystals for which no influence of a base needs to be taken into consideration are settled to the 3C structure. That is, a polycrystal film with a uniform crystal structure can be formed. Meanwhile, at a high temperature, the 3C structure, a 6H structure, a 4H structure, and the like are formed, and it is difficult to form a polycrystal film with a uniform crystal structure.

In the present embodiment, 3C—SiC that can be formed at a low temperature is applied to the gate electrode 18. Accordingly, diffusion of the p-type impurity at the time of forming the gate electrode 18 is suppressed. Further, deterioration of the quality of the gate insulating film 16 is suppressed. Therefore, the MOSFET with improved reliability can be realized.

As the p-type impurity introduced into the gate electrode 18, by applying aluminum (Al), gallium (Ga), or indium (In), which has a larger atomic radius than boron (B), the diffusion of the p-type impurity is further suppressed. Therefore, the MOSFET with further improved reliability can be realized.

A volume ratio occupied by 3C—SiC of SiC existing in the gate electrode 18 is desirably 90% or more. Further, all of the SiC existing in the gate electrode 18 is desirably 3C—SiC in a substantial manner. If other crystal forms such as 4H—SiC are mixed, resistance of the gate electrode 18 may be increased. It can be considered that the increase in resistance is caused by high resistance of an interface portion of different crystal forms.

As described above, the MOSFET having low on-resistance is realized, similarly to the first embodiment. Further, the MOSFET with improved reliability is realized. Further, the MOSFET having a high threshold voltage is realized.

Third Embodiment

A semiconductor device of the present embodiment is similar to the first embodiment except that a p-type fifth SiC region is further included between an end portion of a metal layer at a side of a second plane and a first SiC region, and a p-type sixth SiC region is further included between an end portion of a gate insulating film at the side of the second plane and the first SiC region. In other words, the semiconductor device of the present embodiment is similar to the first embodiment except that the p-type fifth SiC region is further included between a bottom portion of a second trench and the first SiC region, and the p-type sixth SiC region is further included between a bottom portion of a first trench and the first SiC region. Therefore, description of content overlapping with the first embodiment is omitted.

Figure 4:
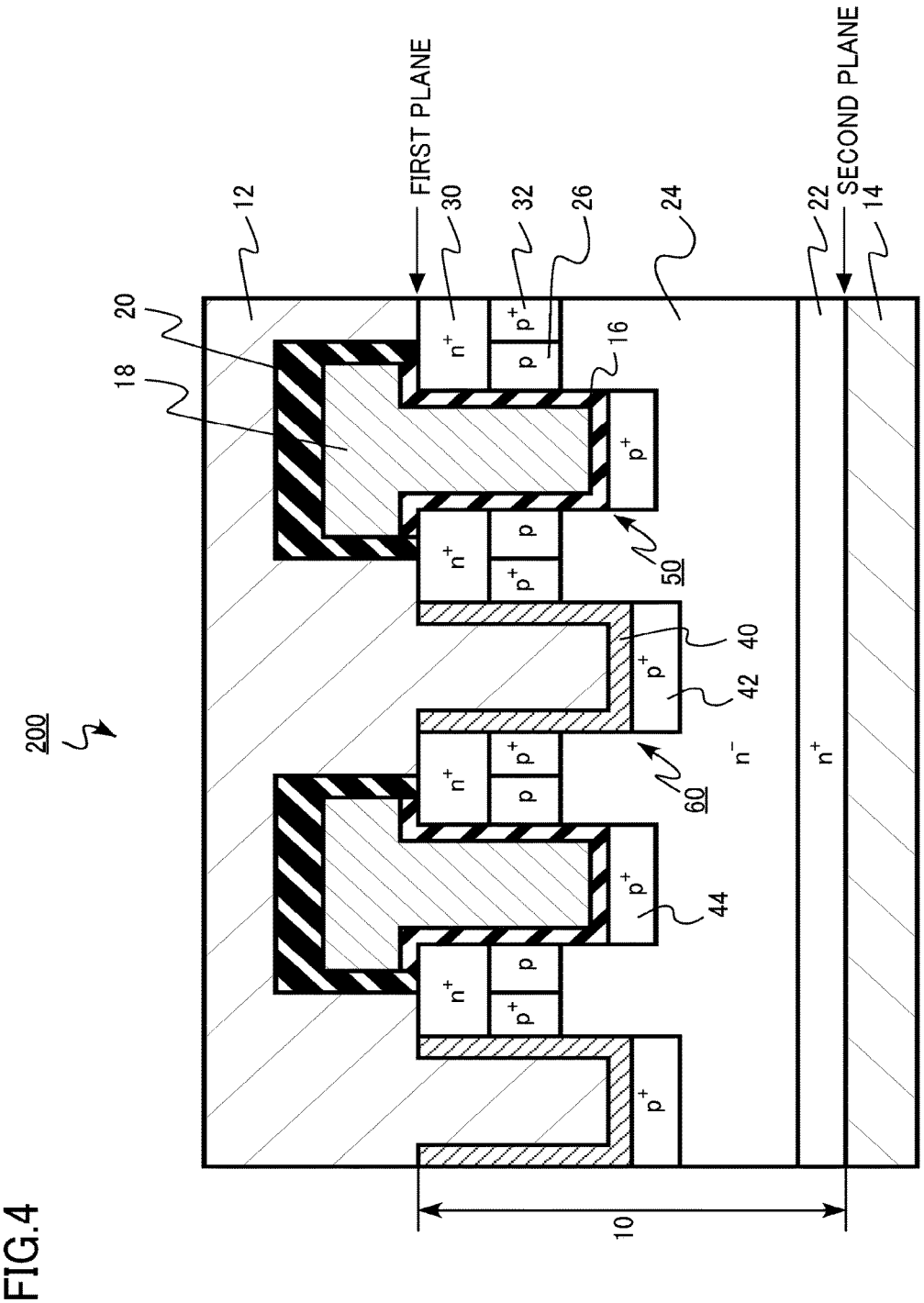
FIG. 4 is a schematic sectional view illustrating a semiconductor device according to a third embodiment.

FIG. 4 is a schematic sectional view illustrating a configuration of a MOSFET that is a semiconductor device of the present embodiment. A MOSFET 200 is a DIMOSFET. The MOSFET 200 is an n-type MOSFET using an electron as a carrier. Further, the MOSFET 200 is a MOSFET having a trench gate structure in which a gate electrode is provided in a trench.

The MOSFET 200 includes an SiC layer 10, a source electrode (first electrode) 12, a drain electrode (second electrode) 14, a gate insulating film 16, a gate electrode 18, and an interlayer insulating film 20. The SiC layer 10 includes a drain region 22, a drift region (n-type first SiC region) 24, a well region (p-type second SiC region) 26, a source region (n-type third SiC region) 30, a well contact region (p-type fourth SiC region) 32, a metal layer 40, an anode region (p-type fifth SiC region) 42, and an electric field reduction region (p-type sixth SiC region) 44. A first trench 50 and a second trench 60 are provided in the SiC layer 10.

The anode region 42 is provided between the metal layer 40 of a bottom portion of the second trench 60, and the drift region 24. The anode region 42 is p$^+$-type SiC.

The anode region 42 contains aluminum (Al) as a p-type impurity, for example. The concentration of the p-type impurity of the anode region 42 is from $1\times10^{18}$ to $1\times10^{21}$ cm$^{-3}$, both inclusive, for example.

The electric field reduction region 44 is provided between the gate insulating film 16 of a bottom portion of the first trench 50, and the drift region 24. The electric field reduction region 44 is p$^+$-type SiC.

The electric field reduction region 44 contains aluminum (Al) as the p-type impurity, for example. The concentration of the p-type impurity of the electric field reduction region 44 is from $1\times10^{18}$ to $1\times10^{21}$ cm$^{-3}$, both inclusive, for example.

The source electrode 12, the metal layer 40, the anode region 42, the drift region 24, the drain region 22, and the drain electrode 14 configure a PIN diode. This PIN diode is a so-called body diode.

When a voltage relatively positive to the drain electrode 14 is applied to the source electrode 12, the body diode becomes an ON state, and a current flows from the source electrode 12 to the drain electrode 14 through an interface of the source electrode 12 and the drift region 24. Meanwhile, when the MOSFET 200 is the ON state, that is, a voltage relatively negative to the drain electrode 14 is applied to the source electrode 12, the body diode becomes an OFF state.

For example, in a case where the MOSFET 200 is applied as a switching device of an inverter, the MOSFET 200 can allow a large reflux current to flow by the PIN diode.

Further, the electric field reduction region 44 is provided in the bottom portion of the first trench 50, so that concentration of an electric field in corner portions of the bottom portion of the first trench 50 is further reduced. Therefore, breakdown of the gate insulating film 16 is further suppressed.

As described above, according to the present embodiment, the MOSFET 200 having low on-resistance is realized, similarly to the first embodiment. Further, the MOSFET 200 with improved reliability is realized. Further, the MOSFET 200 that allows a large reflux current to flow is realized.

Fourth Embodiment

A semiconductor device of the present embodiment is similar to the first embodiment except that a double Schottky diode is included. Therefore, description of content overlapping with the first embodiment is omitted.

Figure 5:
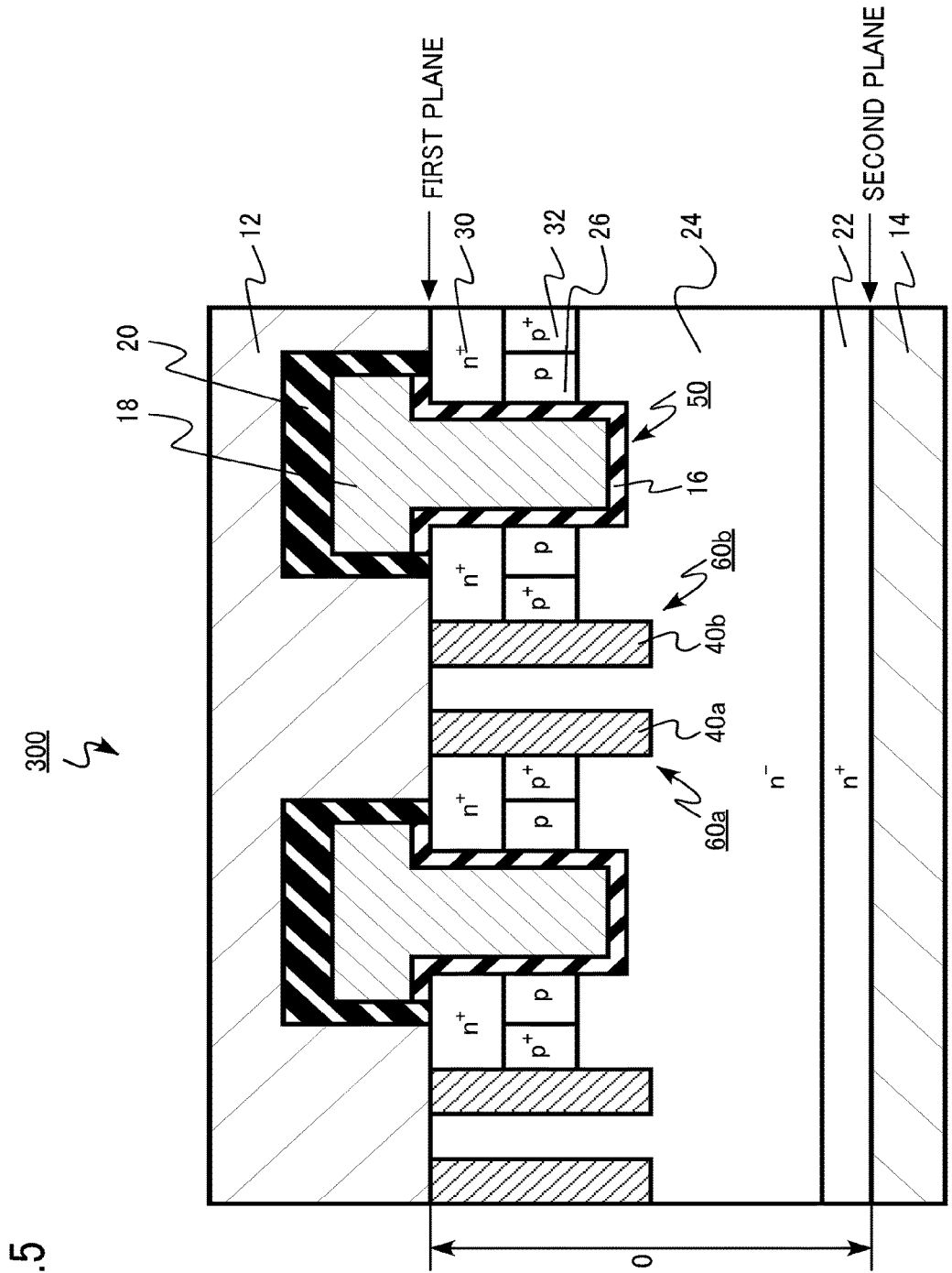
FIG. 5 is a schematic sectional view illustrating a semiconductor device according to a fourth embodiment.

FIG. 5 is a schematic sectional view illustrating a configuration of a MOSFET that is a semiconductor device of the present embodiment. A MOSFET 300 is a DIMOSFET. The MOSFET 300 is an n-type MOSFET using an electron as a carrier. Further, the MOSFET 300 is a MOSFET having a trench gate structure in which a gate electrode is provided in a trench.

The MOSFET 300 includes an SiC layer 10, a source electrode (first electrode) 12, a drain electrode (second electrode) 14, a gate insulating film 16, a gate electrode 18, and an interlayer insulating film 20. The SiC layer 10 includes a drain region 22, a drift region (n-type first SiC region) 24, a well region (p-type second SiC region) 26, a source region (n-type third SiC region) 30, a well contact region (p-type fourth SiC region) 32, and metal layers 40*a* and 40*b*. A first trench 50 and second trenches 60*a* and 60*b* are provided in the SiC layer 10.

The metal layer 40a is provided in the second trench 60a. The metal layer 40b is provided in the second trench 60b.

The source electrode 12, the metal layers 40a and 40b, the drift region 24, the drain region 22, and the drain electrode 14 configure a double Schottky diode. This double Schottky diode is a so-called body diode.

When a voltage relatively positive to the drain electrode 14 is applied to the source electrode 12, the body diode becomes an ON state, and a current flows from the source electrode 12 to the drain electrode 14 through an interface of the source electrode 12 and the drift region 24. Meanwhile, when the MOSFET 300 becomes the ON state, that is, when a voltage relatively negative to the drain electrode 14 is applied to the source electrode 12, the body diode becomes an OFF state. At this time, the interface of the source electrode 12 and the drift region 24 is covered with a depletion layer extending from the metal layer 40a and the metal layer 40b. Therefore, a leak current of the body diode is decreased.

For example, in a case where the MOSFET 300 is applied as a switching device of an inverter, the MOSFET 300 can allow a large reflux current to flow by the double Schottky diode.

Further, because of the double Schottky diode, a switching speed is improved, compared with a PIN diode. Further, a leak current at the time of reverse bias is decreased, compared with a Schottky diode.

Note that the double Schottky diode is formed such that a trench electrode having a high Schottky barrier surrounds an electrode having a low Schottky barrier. The trench electrode can have various shapes such as a line manner, a square, a hexagon. Further, an embedded metal region having a plurality of high Schottky barriers may be dispersed in a mesh manner.

As described above, according to the present embodiment, the MOSFET 300 having low on-resistance is realized, similarly to the first embodiment. Further, the MOSFET 300 with improved reliability is realized. Further, the MOSFET 300 that allows a large reflux current to flow is realized.

Fifth Embodiment

A semiconductor device of the present embodiment is similar to the first embodiment except that a second trench is embedded with a metal layer only. Therefore, description of content overlapping with the first embodiment is omitted.

Figure 6:
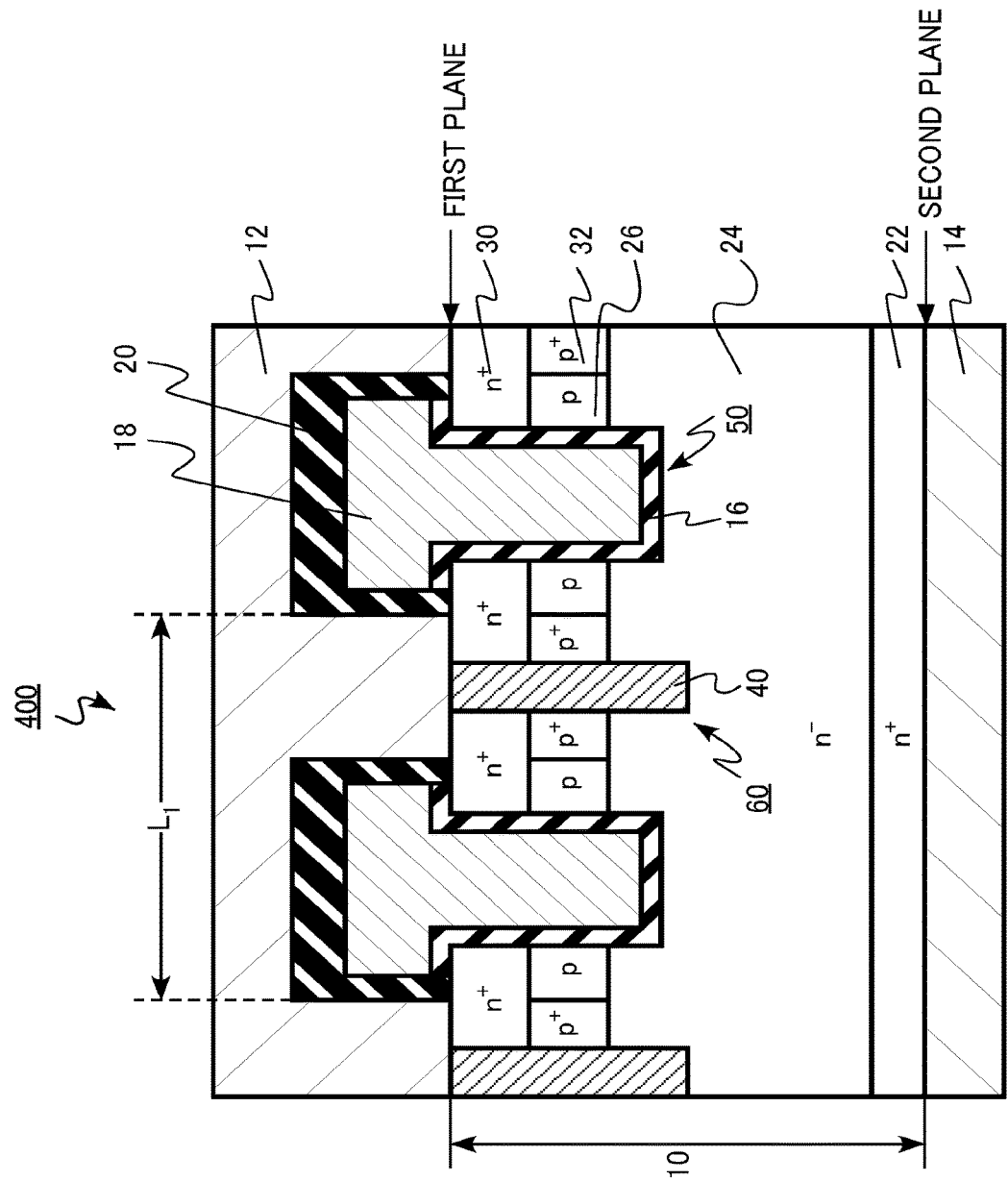
FIG. 6 is a schematic sectional view illustrating a semiconductor device according to a fifth embodiment.

FIG. 6 is a schematic sectional view illustrating a configuration of a MOSFET that is a semiconductor device of the present embodiment. A MOSFET 400 is a DIMOSFET. The MOSFET 400 is an n-type MOSFET using an electron as a carrier. Further, the MOSFET 400 is a MOSFET having a trench gate structure in which a gate electrode is provided in a trench.

A second trench 60 is embedded with a metal layer 40 only. Since an inside of the second trench 60 is the metal layer 40 only, a pitch ($L_1$ in FIG. 6) of a unit cell of the MOSFET 400 can be made smaller than the pitch ($L_1$ in FIG. 1) of the unit cell of the MOSFET 100 of the first embodiment. Therefore, on-resistance of the MOSFET 400 is further decreased, compared with the MOSFET 100.

As described above, according to the present embodiment, the MOSFET 400 having lower on-resistance than the first embodiment is realized.

Sixth Embodiment

A semiconductor device of the present embodiment is different from the second embodiment in that a gate electrode has a stacked structure of a first metal film and a second metal film. Therefore, description of content overlapping with the second embodiment is omitted.

Figure 7:
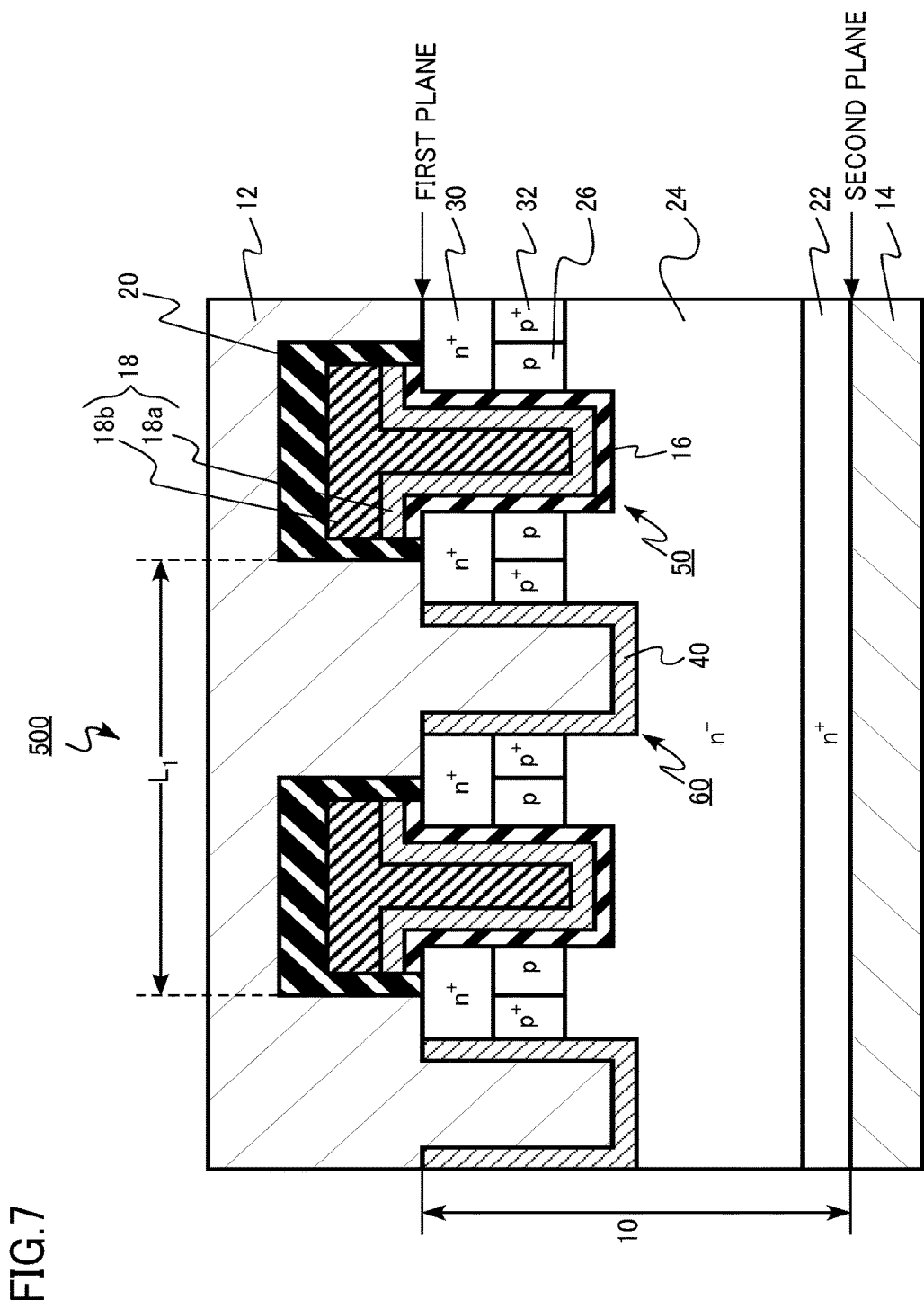
FIG. 7 is a schematic sectional view illustrating a semiconductor device according to a sixth embodiment.

FIG. 7 is a schematic sectional view illustrating a configuration of a MOSFET that is a semiconductor device of the present embodiment. A MOSFET 500 is a DIMOSFET. The MOSFET 500 is an n-type MOSFET using an electron as a carrier. Further, the MOSFET 500 is a MOSFET having a trench gate structure in which a gate electrode is provided in a gate electrode.

A gate electrode 18 has a stacked structure of a first metal film 18a and a second metal film 18b. The first metal film 18a is 3C—SiC containing a p-type impurity. The second metal film 18b is a titanium nitride (TiN), for example.

The first metal film 18a is made of approximately the same material as a metal layer 40, and has approximately the same film thickness.

In manufacturing the MOSFET 500, for example, in manufacturing the metal layer 40 by low-temperature growth after forming a gate insulating film 16, the first metal film 18a is formed on the gate insulating film 16 at the same time. Since 3C—SiC can be formed at a low temperature, the first metal film 18a can be formed at the same time with the metal layer 40 after the gate insulating film 16 is formed.

As described above, according to the present embodiment, the MOSFET having low on-resistance is realized, similarly to the second embodiment. Further, the MOSFET with improved reliability is realized. Further, the MOSFET having a high threshold voltage is realized.

Seventh Embodiment

A semiconductor device of the present embodiment is similar to that of the fourth embodiment except that a part of a source electrode is embedded in a second trench.

Figure 8:
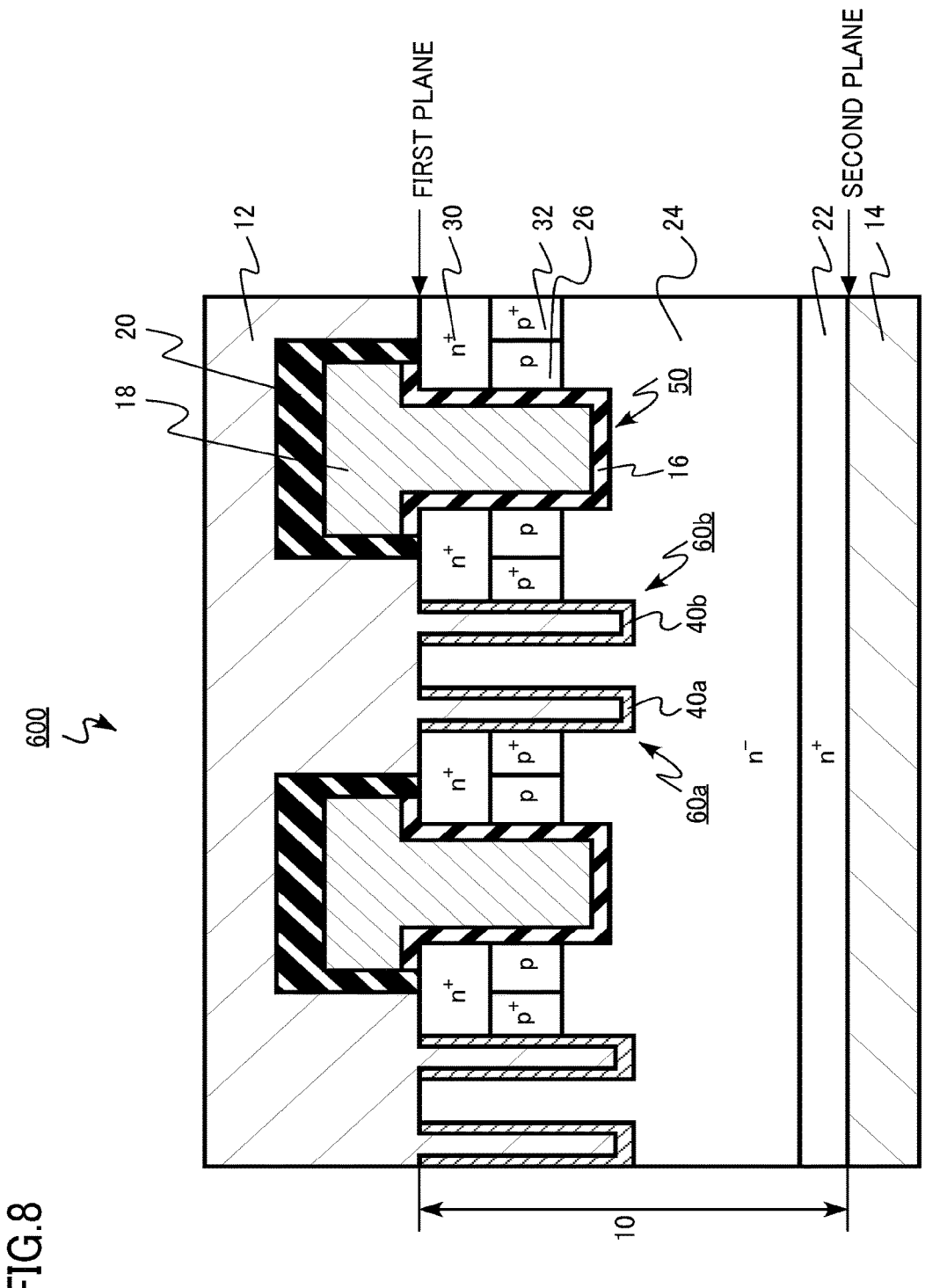
FIG. 8 is a schematic sectional view illustrating a semiconductor device according to a seventh embodiment.

FIG. 8 is a schematic sectional view illustrating a configuration of a MOSFET that is a semiconductor device of the present embodiment. A MOSFET 600 is a DIMOSFET. The MOSFET 600 is a n-type MOSFET using an electron as a carrier. Further, the MOSFET 600 is a MOSFET having a trench gate structure in which a gate electrode is provided in a trench.

A metal layer 40a is provided in a second trench 60a. A metal layer 40b is provided in a second trench 60b.

Apart of a source electrode 12 is embedded in the second trench 60a. A part of the source electrode 12 is embedded in the second trench 60b.

According to the present embodiment, the MOSFET 600 having low on-resistance is realized, similarly to the fourth embodiment. Further, the MOSFET 600 with improved reliability is realized. Further, the MOSFET 600 that allows a large reflux current to flow is realized.

In the first to seventh embodiments, a case of silicon carbide (SiC) in a metal state, where the metal layer 40 contains the p-type impurity, have been exemplarily described. However, other materials can also be applied to the metal layer 40, such as polycrystal diamond in a metal state containing boron (B), polycrystal gallium nitride in a metal state containing magnesium (Mg), and polycrystal aluminum gallium nitride in a metal state containing magnesium (Mg). The polycrystal diamond in a metal state containing boron (B), the polycrystal gallium nitride in a metal state containing magnesium (Mg), and the polycrystal aluminum gallium nitride in a metal state containing magnesium (Mg) can be formed by a CVD method at a low temperature of about 1000° C.

In the first to seventh embodiments, a case of 4H—SiC as an SiC layer has been exemplarily described. However, other crystal forms such as 3C—SiC and 6H—SiC can also be used.

In the first to seventh embodiments, nitrogen (N) has been mainly exemplarily described as the n-type impurity of SiC. However, phosphorus (P), arsenic (As), antimony (Sb), or the like can also be applied in place of nitrogen (N). Further, aluminum (Al) has been mainly exemplarily described as the p-type impurity of SiC. However, boron (B), gallium (Ga), indium (In), or the like can also be applied in place of aluminum (Al).

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
an SiC layer having a first plane and a second plane, the SiC layer being 4H—SiC;
an n-type first SiC region provided in the SiC layer;
p-type second SiC regions provided in the SiC layer, the second SiC regions provided between the first SiC region and the first plane;
n-type third SiC regions provided in the SiC layer, the third SiC regions provided between the second SiC regions and the first plane;
a gate electrode provided between one of the second SiC regions and another one of the second SiC regions neighbouring the one of the second SiC regions;
a gate insulating film provided between the gate electrode and the one of the second SiC regions;
a metal layer provided between the one of the second SiC regions and an other one of the second SiC regions neighbouring the one of the second SiC regions, the one of the second SiC regions disposed between the another one of the second SiC regions and the other one of the second SiC regions, the metal layer having a work function of 6.5 eV or more, a part of the first SiC region is disposed between the gate insulating film and the metal layer, the metal layer being in physical contact with the part of the first SiC region;
a first electrode electrically connected to the metal layer, the metal layer provided between the first SiC region and the first electrode; and
a second electrode, the SiC layer provided between the first electrode and the second electrode.

2. The device according to claim 1, wherein the metal layer includes SiC having a concentration of a p-type impurity of $1\times10^{20}$ cm$^{-3}$ or more.

3. The device according to claim 2, wherein the p-type impurity is at least one selected from aluminum (Al), gallium (Ga), and indium (In).

4. The device according to claim 2, wherein the metal layer includes 3C-SiC.

5. The device according to claim 1, further comprising: a junction between the metal layer and the first SiC region, the junction being a Schottky junction.

6. The device according to claim 1, further comprising: a p-type fourth SiC region provided between the metal layer and the one of the second SiC regions, the fourth SiC region having a higher p-type impurity concentration than the second SiC regions, the metal layer being in contact with the fourth SiC region.

7. The device according to claim 1, further comprising: a p-type fifth SiC region provided between the first SiC region and the metal layer.

8. The device according to claim 1, wherein a distance between the metal layer and the second plane is shorter than a distance between the gate insulating film and the second plane.

9. The device according to claim 1, wherein the gate electrode includes 3C-SiC containing at least one selected from aluminum (Al), gallium (Ga), and indium (In).

10. A semiconductor device comprising:
an SiC layer having a first plane and a second plane;
an n-type first SiC region provided in the SiC layer;
p-type second SiC regions provided in the SiC layer, the second SiC regions provided between the first SiC region and the first plane;
n-type third SiC regions provided in the SiC layer, the third SiC regions provided between the second SiC regions and the first plane;
a gate electrode provided between one of the second SiC regions and another one of the second SiC regions neighbouring the one of the second SiC regions;
a gate insulating film provided between the gate electrode and the one of the second SiC regions;
a metal layer provided between the one of the second SiC regions and an other one of the second SiC regions neighbouring the one of the second SiC regions, the one of the second SiC regions disposed between the another one of the second SiC regions and the other one of the second SiC regions, the metal layer having a work function of 6.5 eV or more, a part of the first SiC region is disposed between the gate insulating film and the metal layer, the metal layer being in contact with the part of the first SiC region;
a first electrode electrically connected to the metal layer, the metal layer provided between the first SiC region and the first electrode; and
a second electrode, the SiC layer provided between the first electrode and the second electrode, wherein
the gate electrode includes a first metal film and a second metal film, the first metal film is made of substantially same material as the metal layer, and the first metal film has an approximately same film thickness as the metal layer.

11. The device according to claim 10, wherein the metal layer includes SiC having a concentration of a p-type impurity of $1\times10^{20}$ cm$^{-3}$ or more.

12. The device according to claim 11, wherein the p-type impurity is at least one selected from aluminum (Al), gallium (Ga), and indium (In).

13. The device according to claim 12, wherein the metal layer includes 3C-SiC.

* * * * *